United States Patent
Hartig et al.

[11] Patent Number: 5,262,032
[45] Date of Patent: Nov. 16, 1993

[54] SPUTTERING APPARATUS WITH ROTATING TARGET AND TARGET COOLING

[75] Inventors: Klaus Hartig, Ronneburg, Fed. Rep. of Germany; Anton Dietrich, Triesen, Liechtenstein; Joachim Szczyrbowski, Goldbach, Fed. Rep. of Germany

[73] Assignee: Leybold Aktiengesellschaft, Hanau, Fed. Rep. of Germany

[21] Appl. No.: 918,142

[22] Filed: Jul. 23, 1992

Related U.S. Application Data

[63] Continuation of Ser. No. 744,277, Aug. 13, 1991, abandoned.

[30] Foreign Application Priority Data

May 28, 1991 [DE] Fed. Rep. of Germany ....... 4117368

[51] Int. Cl.⁵ .............................................. C23C 14/34
[52] U.S. Cl. ................. 204/298.21; 204/298.09; 204/298.22; 204/192.12
[58] Field of Search ............ 204/192.12, 298.09, 204/298.18, 298.21, 298.22

[56] References Cited

U.S. PATENT DOCUMENTS

| | | | |
|---|---|---|---|
| 3,829,373 | 8/1974 | Kuehnle | 204/298.09 X |
| 3,878,085 | 4/1975 | Corbani | 204/298.21 X |
| 4,116,806 | 9/1978 | Love et al. | 204/298.09 X |
| 4,275,289 | 6/1981 | Lord | 219/121 |
| 4,443,318 | 4/1989 | McKelvey | 204/298.21 X |
| 4,445,997 | 5/1984 | McKelvey | 204/298.21 X |
| 4,466,877 | 8/1984 | McKelvey | 204/298.18 X |

FOREIGN PATENT DOCUMENTS

| | | |
|---|---|---|
| 0072618 | 2/1983 | European Pat. Off. . |
| 0393344 | 10/1990 | European Pat. Off. ....... 204/298.09 |
| 3521318 | 12/1986 | Fed. Rep. of Germany . |
| 0823459 | 4/1981 | U.S.S.R. ............... 204/298.09 |
| 2002036 | 2/1979 | United Kingdom ........... 204/298.09 |

OTHER PUBLICATIONS

Wright & Beardow "Design Advances and Applications of the Rotatable Cylindrical Magnetron" J. Vac. Sci. Techn. A4(3) Jun. 1988 pp. 388–392.

*Primary Examiner*—Nam Nguyen
*Attorney, Agent, or Firm*—Felfe & Lynch

[57] ABSTRACT

A sputtering apparatus is presented, especially one with a magnetron cathode and rotating target (1), and target cooling performed by a liquid coolant, preferably water, in which provision is made for the cooling to be concentrated on the area or areas of the rotating target (1) which are exposed to the heat produced by the plasma (12), and the magnets (28, 29, 30, 31) of the magnet assembly (23) form at least one cooling passage (34, 35).

10 Claims, 5 Drawing Sheets

SPUTTERING APPARATUS WITH ROTATING TARGET AND TARGET COOLING

This application is a continuation of application Ser. No. 07/744,277, filed Aug. 13, 1991 abandoned.

BACKGROUND OF THE INVENTION

The invention relates to a sputtering apparatus, especially one with a magnetron cathode with rotating target and target cooling performed by a fluid coolant, preferably water.

In sputtering processes, high-power sputtering apparatus are used in practice, among other things, in which a magnetic field in front of the cathode increases the probability of collisions of the particles and hence the probability of their ionization. The heart of these high-power sputtering apparatus is the so-called magnetron cathode.

A magnetron cathode of this kind is described, for example, in German Patent 2417288. This corresponds to U.S. Pat. No. 4,166,018, which is incorporated herein by reference.

In this patent there is described a cathode sputtering apparatus with a high sputtering rate, with a cathode which has on one of its surfaces the material that is to be sputtered and deposited on a substrate, and having a magnet system arranged such that magnetic lines of force issuing from the sputtering surface and returning thereto form a discharge area which is in the shape of a closed loop, and having an anode disposed outside of the paths of the sputtered material and moving from the sputtering surface to the substrate.

In the said patent the cathode surface to be sputtered and facing the substrate to are sprayed be flat, that the substrate is moved across and close to the discharge area, parallel to the flat sputtering surface, and that the magnet system producing the magnetic field is disposed on the side of the cathode facing away from the flat sputtering surface.

The state of the art also includes sputtering apparatus with a rotating magnetron cathode. The prospectus of Airco Coating Technology, A Division of the BOC Group, Inc., identified ACT10110K988, hereinafter called the "Airco Prospectus," describes the construction and the manner of operation of such a sputtering apparatus, known in itself, which has a rotating magnetron cathode. As it appears from the illustrations and the text of the Airco Prospectus, it is precisely only the cylinder-shaped or tube-shaped target that rotates. The stationary magnet unit of the magnetron cathode is situated in the interior of the target.

Important components of a magnetron cathode of this kind, known in itself, are, among others (see the Airco Prospectus in this regard), in addition to the rotating cylindrical target and the stationary magnet unit, the target drive system, a water cooling system, a vacuum chamber in which the rotating target and the substrate, among other things, are situated, and a power supply unit for the cathode. In practice, the target is applied as a coating to a tube consisting, for example, of copper. The system, consisting of a target coating and copper tube, rotates in front of the burning plasma.

Also pertaining to the state of the art is European patent 0070899, to which U.S. Pat. No. 4,356,073 corresponds (hereby incorporated by reference). In this patent an apparatus for the sputtering of thin films of a selected coating material onto substantially planar substrates is described, consisting of an evacuable coating chamber, a cathode mounted horizontally in this coating chamber and having an elongated, cylindrical tube element on whose outer surface a coating of the coating material to be sputtered has been applied, and magnetic means which are disposed in this tube element in order to provide a sputtering zone extending longitudinally therefrom.

U.S. Pat. No. 4,356,073 discloses means for rotating this tube element about its longitudinal axis in order to bring various parts of the coating material into a sputtering position with respect to the above-mentioned magnet means and inside of the aforesaid sputtering zone, and by means situated in the coating chamber for the horizontal support of the substrates and for transporting them past the magnet means so that these substrates receive the sputtered material.

In particular it can be seen in the drawing entitled "C-MAG ™ Rotatable Magnetron" in the Airco Prospectus, hereinafter called "Airco Prospectus Drawing," that it is state of the art to feed water as coolant through a water line into the interior of the rotating target. The water in the Airco Prospectus drawing washes around the magnet assembly represented therein.

It can be seen from the Airco Prospectus Drawing that the cross section for the water flow expands quite considerably. The cross section of the feed line of the subject matter of the Airco Prospectus Drawing is significantly less than the flow cross section within the rotating target in the Airco Prospectus Drawing. The velocity of flow of the coolant is accordingly greatly reduced by this enlargement of the flow cross section. In the area of the heating caused by the plasma local overheating can therefore occur, which is extremely disadvantageous to the sputtering process. There is a considerable danger of the formation of steam bubbles.

SUMMARY OF THE INVENTION

The invention is sets for itself the following objectives:

The above-described disadvantages of the state of the art are to be avoided. A fundamental improvement is to be achieved in the cooling of the rotating target, especially when it is used in magnetron sputtering apparatus. Especially, a more uniform cooling is to be achieved. This again has the advantage that the sputtering process, especially reactive sputtering, is simplified. Thus it is possible to improve the performance of the sputtering apparatus.

The stated objectives are achieved by concentrating the cooling on the area or areas of the rotating target which are exposed to the plasma's development of heat.

This can be accomplished by narrowing the flow cross section of the coolant in the area or areas of the rotating target which are exposed to the plasma's development of heat.

For this, provision is made for disposing opposite the plasma at least one cooling passage for the liquid coolant in the interior of the tubularly configured, rotating target.

In a sputtering apparatus which is equipped with a rotating target which is mounted on a rotating target support tube, it is proposed that at least one cooling passage be disposed within the interior chamber that is surrounded by the inner wall of the target support tube.

In a sputtering apparatus with a magnet assembly which is stationary within the rotating target, it is proposed, as an especially space-saving solution, that the magnets of the magnet assembly form at least one cooling passage.

Alternatively, the baffle can be provided with a magnet assembly which forms a cooling passage together with the inside wall of the rotating target or rotating target support tube.

Especially effective cooling is achieved by the fact that the target support tube has in its wall cooling passages which are continually carried during rotation through the area adjacent to the plasma and coolant flows through them in this area.

To create better designing conditions for the inclusion of the cooling passages, provisions can generally be made for the use of two target support tubes instead of one target support tube, and for the cooling passages to be contained in the additional target support tube.

Further statements made in connection with the target support tube and the cooling passages contained in the target support tube shall apply correspondingly to the creation of cooling passages in an additional target support tube.

It is furthermore proposed that the target support tube have in its wall cooling passages which during rotation are brought through the area adjacent to the plasma step-wise, by the stop-and-go method, while water flows through them in this area.

An especially compact construction is achieved if the coolant enters from one end of the target support tube and flows through at least a first cooling passage disposed in the target support tube, and is reversed at the opposite end of the target support tube by a reversing device, flows into a second cooling passage of the target support tube, and flows through this second cooling passage in a direction opposite that of its first run.

In continuation of this design idea it is proposed that the apparatus for feeding the cooling passages in the target support tube and the reversing device for the cooling passages together form a meandering cooling passage system in the area of heat development of the plasma.

In the examples of embodiment provision is made for the gaskets between the rotating target or rotating support tube at the one end and the stationary components, such as magnet assembly, channeling plate, infeed device, outfeed device, and reversing device at the other, are configured as wiping gaskets, nonwiping gaskets, labyrinth packing, gap packing or grooved packing.

To avoid wiping contact with the inside wall of the target support tube or of the additional target support tube it is proposed that the cooling passages be configured as hose-like parts carrying coolant, which are disposed in the area of heat development of the plasma, preferably between the magnets.

At the same time provision can be made for the hose-like parts to have a cross section which corresponds substantially to the free cross section between the magnets.

To reduce friction between the rotating target assembly and the envelope of the cooling passages it is furthermore proposed that the area of the envelope adjacent the inside of the rotating target or rotating target support tube of at least one cooling passage disposed in the magnet assembly be configured as a diaphragm which, when pressure in the cooling passage is relieved, produces by its shape a distance between the envelope and the inside of the rotating target or rotating target support tube.

The following advantages are achieved by the invention:

Local overheating and the disadvantageous effects which it entails, such as steam bubble formation etc., are prevented. A fundamental improvement of the cooling of the rotating target is achieved. In this manner an improvement of the performance of the sputtering apparatus is brought about.

DETAILED DESCRIPTION OF THE PREFERRED EMBODIMENT

Figure 1:
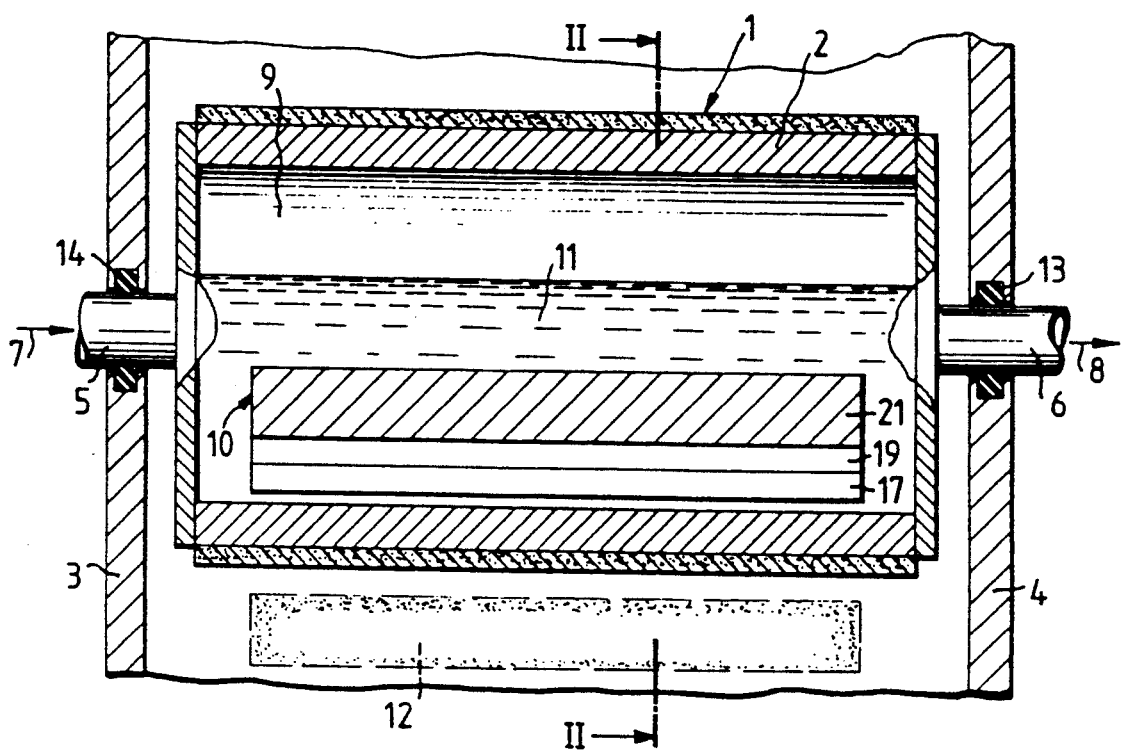
FIG. 1 shows diagrammatically and in a side view a sectional representation a portion of a sputtering apparatus with a rotating target according to the state of the art.

FIG. 1 depicts a known apparatus having a rotating target, a target driving system, the magnet assembly of a magnetron, a cooling water supply for the cathode, a power supply for the cathode, and a vacuum chamber. Within the vacuum chamber are, among other things, the rotating target and a substrate on which a coating of sputtering material grows during the sputtering process.

Atmospheric pressure prevails in the tubular rotating target. Outside the rotating target a vacuum prevails.

Further details on the known sputtering apparatus with rotating target can be found in the Airco Prospectus and in U.S. Pat. No. 4,356,073.

The sputtering apparatus of the state of the art, as it is shown in the area of the rotating target in FIG. 1, has, in addition to the rotating target 1, a rotating target support tube 2 for the rotating target. The rotating target is journaled on the tubular sections 5 and 6 which are sealed against the walls 3,4 of the vacuum chamber by the packings 13 and 14.

Furthermore, these tubular sections serve to carry the coolant. The incoming coolant, water for example, is represented by the arrow 7 and the exiting coolant by the arrow 8. In the interior of the tubular, rotating target support tube, which is identified as a whole by 9, is the magnet assembly 10 of the magnetron. The magnet assembly is flooded with water 11.

Obviously the velocity of flow of the water in tube 5 is significantly greater than the velocity of flow in the interior chamber 9, since the cross section of the water flow as it emerges from the tube 5 and enters the interior chamber 9 is considerably expanded.

The result of the relatively low velocity of flow in chamber 9 is that, disadvantageously, the areas of the rotating target and target support tube which enter the zone of the heating action of the plasma 12 are at least locally overheated, so that the formation of steam bubbles and other undesired phenomena occur.

Figure 2:
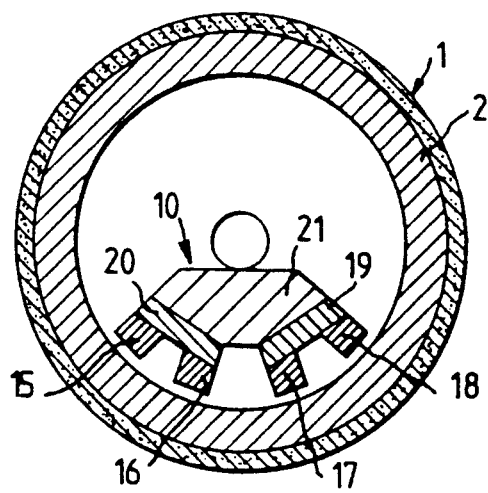
FIG. 2 is a cross section taken on line 11—11 of FIG. 1.

The rotating target 1 and the target support tube 2 can be seen in FIG. 2. Of the magnet assembly, the pairs of magnets 15, 16, and 17, 18 are visible, as well as the corresponding magnet yokes 19 and 20 which in turn are fixed to a holder 21.

As it is described in the literature on the state of the art, target 1 and target support tube 2 rotate, while the magnet assembly with its magnets 15, 16, 17 and 18 and its holder 21 is stationary.

Figure 3:
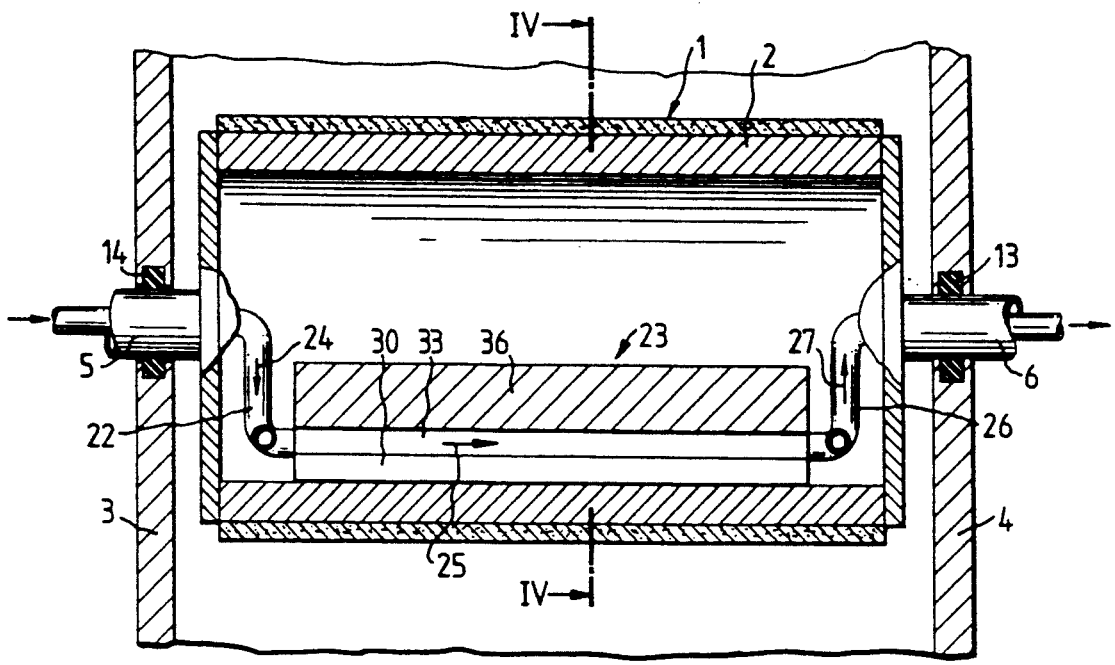
FIG. 3 shows diagrammatically in a sectional representation and in a side view a portion of a sputtering apparatus with a rotating target according to the present invention.
Figure 4:
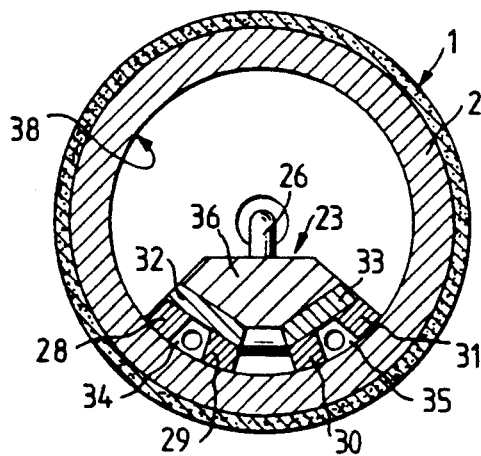
FIG. 4 shows a sectional view corresponding to section line IV—IV of FIG. 3.

FIGS. 3 and 4 shown a first embodiment of the invention. The same reference numbers 1 and 2 have been selected for the rotating target and target support tube, respectively, as were used in FIGS. 1 and 2. The same applies to the vacuum chamber walls 3 and 4, tube sections 5 and 6 and the packings 13 and 14.

Water is carried through the pipeline 22 to the magnet assembly 23 controlled and concentrated manner. The direction of flow is indicated by the arrow 24. The water flows through a predetermined cross section (see FIG. 4) through the magnet assembly 23 (see arrow 25). The water exits (see arrow 27) from the magnet assembly through line 26.

The open spaces 34, 35 which are formed between the magnets 28 and 29 on the one hand and the magnets 30 and 31 on the other, and by the magnet yokes 32 and 33 and the cylindrical inside wall 38, of the target support tube 2 are advantageously used for the cooling passages. The yokes 32, 33 are fixed to a magnet holder 36.

Figure 5:
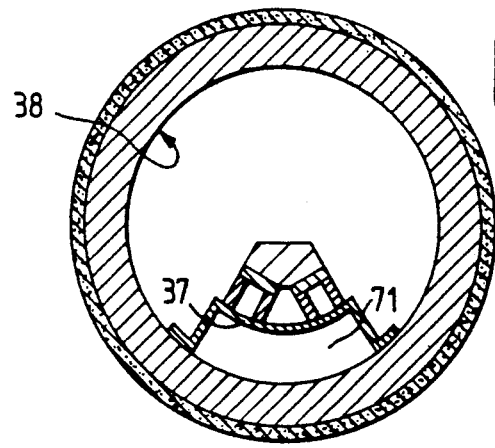
FIG. 5 shows an additional embodiment of the subject matter of the invention, shown in a sectional view corresponding to section line IV—IV of FIG. 3.

In the embodiment represented in FIG. 5, the cooling passage 71 is formed by a channeling plate 37 and a portion of the inside wall 38 of the target support tube.

Figure 6:
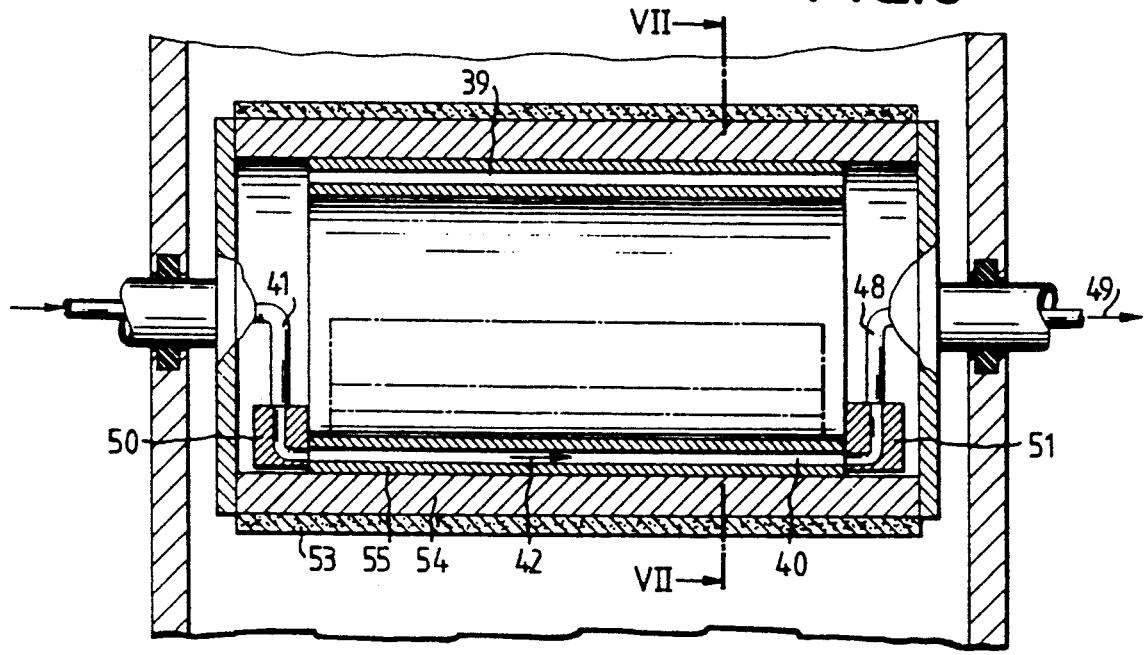
FIG. 6 shows diagrammatically, in a sectional view corresponding to section line VI—VI of FIG. 7 and in side elevation, a portion of a sputtering apparatus with rotating target according to an additional embodiment of the invention.
Figure 7:
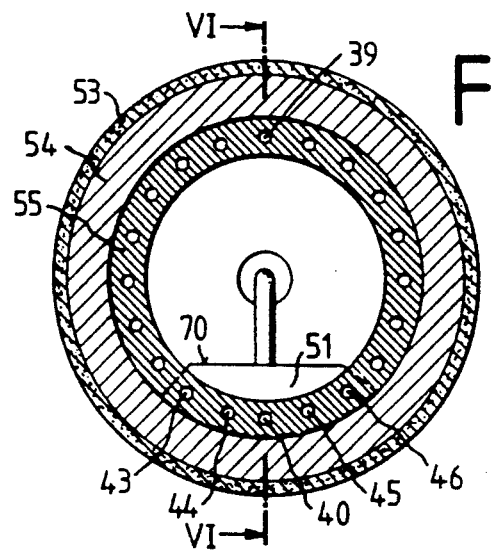
FIG. 7 shows a sectional view corresponding to section line VII—VII of FIG. 6.

The embodiment in FIGS. 6 and 7 comprises an additional support tube 55 having a great number of bores in its wall. Two of these bores are marked 39 and 40 in FIG. 6. Water is fed through line 41, in accordance with the arrows 42, through the heated area of the additional target support tube 55.

An exchange of heat takes place in this area. As it can be seen in FIG. 7, water is pumped through the bores 43, 44, 45, 40 and 46, and thus heat is carried away. The heated water passes out of reach of the rotating target through line 48 in accordance with arrow 49.

While the target 53, the target support tube 54 and the additional target support tube 55 are rotating, the water supply device 50 and the water discharge device 51 are stationary.

In this manner, constantly different bores or cooling passages are used for the heat exchange.

Operation can be either continuous (continuous rotation of the target assembly consisting of target, target support tube, and additional target support tube), or step-wise (revolver method).

The continuous rotation of the rotating target, target support tube and additional target support tube, is especially suitable in the case of an additional target support tube having fine bores.

Figure 8:
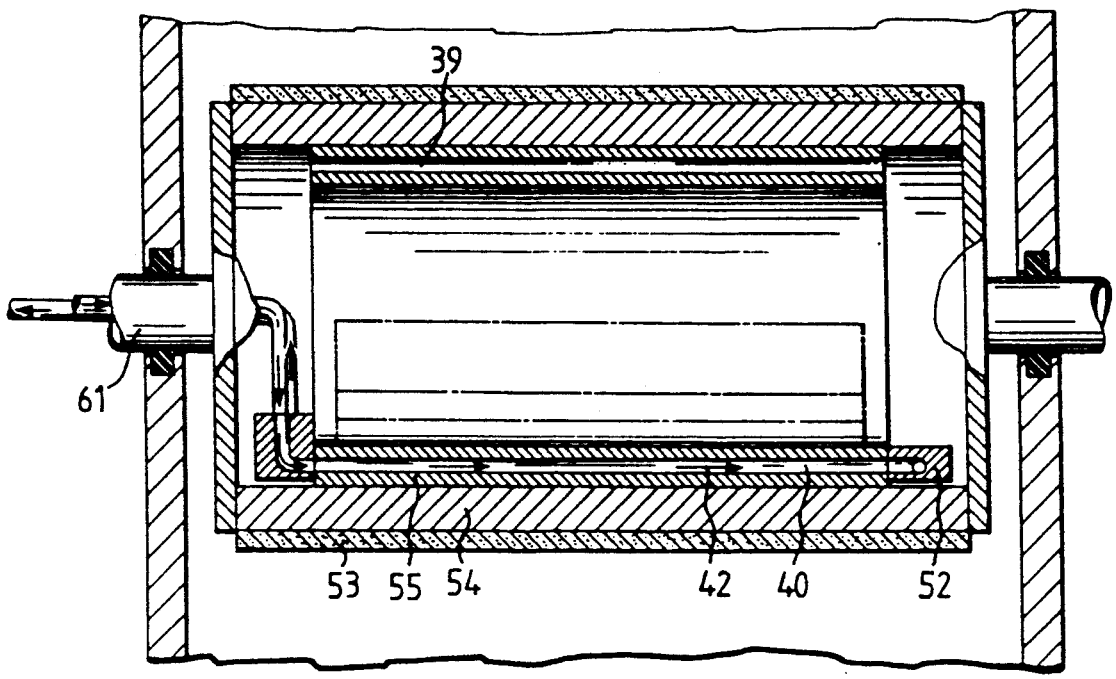
FIG. 8 shows diagrammatically, in a sectional view and in side elevation, a portion of a sputtering apparatus with rotating target according to another embodiment of the present invention.

In FIG. 7, the outline of the water feeding device and of the water discharge device is indicated in broken lines at 70. A modification of the embodiment of FIGS. 6 and 7 is represented in FIGS. 8 and 9.

The modification is that, instead of the water discharge device a water reversing device 52 is provided. The construction and operation of this water reversing device can be seen in FIG. 9.

Water flows through the coolant passage 56 in the additional target support tube in accordance with the arrow 57. It enters into the water reversing device 52. In this water reversing device is a bend 58 which produces a reversal of the water stream. The water then flows through passage 59 in accordance with arrow 60 and out of the additional target support tube.

Figure 9:
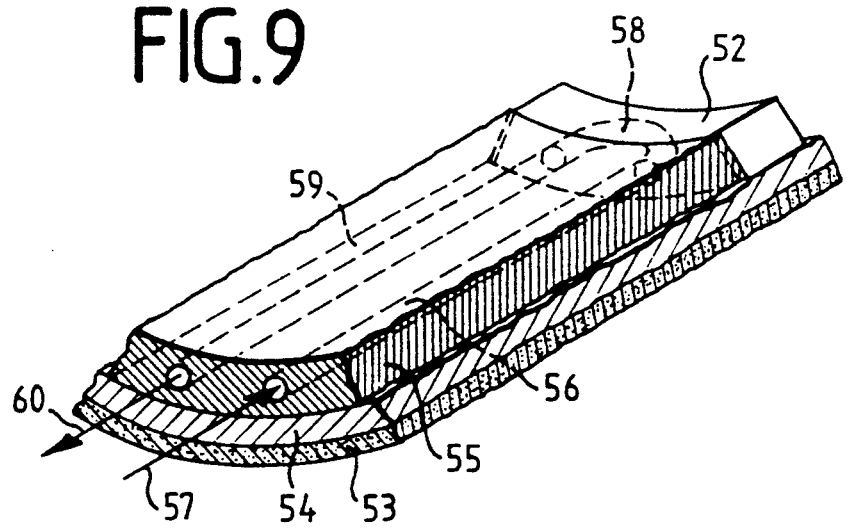
FIG. 9 shows on an enlarged scale and in axiometric representation a detail of the subject of FIG. 8.

If a great number of cooling passages, as shown in FIG. 9, are connected one to another, a meandering flow through the heated areas and thus good cooling can be achieved. The water infeed and water discharge can then be performed through a hub or through a tube section 61, see FIG. 8.

In FIGS. 6 to 9, the rotating target is marked 53, the target support tube 54, and the additional target support tube 55. In the case of the embodiments in FIGS. 6 to 9, the additional target support tube 55 is actually provided for the purpose of containing the cooling passages. The target support tube 54 and additional target support tube 55 can also be made in one piece.

The embodiments of the invention commented on up to this point require gaskets between the inside wall of the target support tube, on the one hand, and, on the other hand, the magnets 28, 29, 30 and 31 in FIG. 4, and the water channeling plate 37 in FIG. 5. Furthermore, gaskets are needed between the additional target support tube 55 on the one hand and, on the other hand, the water infeed device, water discharge device and water reversing device. These gaskets are embodied in known wiping or nonwiping packings. Gap packings, labyrinth packings and grooved packings, among others, can be used.

Figure 10:
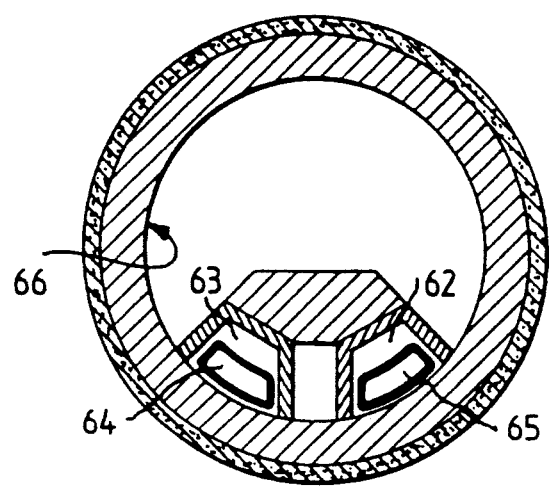
FIG. 10 shows an additional embodiment of the subject matter of the invention, shown in a sectional view corresponding to section line IV—IV of FIG. 3.

Gaskets between the inside wall 66 of the target support tube and the magnets are avoided in the embodiment in FIG. 10. Hoses, such as flexible metal hoses 64, 65 of rectangular cross section, are laid within the free spaces 62 and 63 present in the magnet assembly. Metal hoses of circular cross section can, of course, also be used.

When hoses are used, the inside wall 66 of the target holding tube can be relieved from the pressure of the coolant. Advantageously, therefore, the rotating target and the target support tube can rotate friction-free. In the case of a target rotating step-wise, when a step is to be made, a relieving of the pressure in the hoses 64 and 65 is performed.

Figure 11:
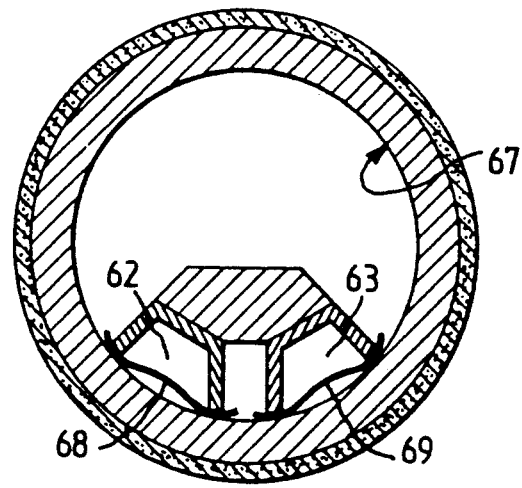
FIG. 11 shows an additional embodiment of the subject matter of the invention, in a sectional view corresponding to section line IV—IV of FIG. 3.

An additional method of relieving the pressure on the inside wall 67 of the target support tube is shown in the embodiment in FIG. 11. Coolant is fed into the free spaces 62 and 63 within the magnet assembly. The separation of the cooling passages from the inside wall 67 of the target support tube is performed by diaphragms 68 and 69.

In the case of step-wise rotation of the rotating target and target support tube, whenever a step of the rotation is to be made, a relieving of pressure in the cooling passage 62 and 63 is performed. In this situation the diaphragms 68 and 69 are also relieved of pressure, and then they assume their original shape shown in FIG. 11, that is, their shape when relieved of pressure. In this manner the rotation-impeding friction on the inside wall is reduced or eliminated.

We claim:

1. Magnetron cathode sputtering apparatus comprising
    a vacuum chamber,
    a tubular target support mounted for rotation in said vacuum chamber, said support having a cylindrical inner wall and a cylindrical outside wall,
    a tubular target fixed on said outside wall,
    a magnet assembly inner said tubular target support and fixed relative to said vacuum chamber, said assembly comprising magnet and yoke means, said magnet is being positioned adjacent to a portion of said inner wall so that a plasma is formed adjacent to a portion of said tubular target directly adjacent to said magnet assembly, and
    coolant conduit means which limits coolant flow, seen in axial cross section of said tubular target support through said yoke means, to a space between said yoke means and said portion of said inner wall.

2. Apparatus as in claim 1 wherein said conduit means comprises said magnets and said inner wall.

3. Apparatus as in claim 2 further comprising gasket means between said magnets and said inner wall, thereby preventing leakage of coolant as said target support rotates relative to said magnet assembly.

4. Apparatus as in claim 1 further comprising a channeling plate between said magnets and said portion of said inner wall, said conduit means comprising said channeling plate and said inner wall.

5. Apparatus as in claim 4 further comprising gasket means between said channeling plate and said inner wall, thereby preventing leakage of coolant as said target support rotates relative to said magnet assembly.

6. Apparatus as in claim 1 further comprising
    an additional support tube fixed to said inner wall of said tubular target support and having a pair of axially opposed ends, said coolant conduit means comprising a plurality of conduits extending axially between said ends in said additional support tube,
    coolant supply means adjacent one end of said additional support tube for supplying coolant to at least one of said conduits in the portion of said inner wall passing adjacent to said magnets, and
    coolant discharge means adjacent to the other end of said additional support tube for receiving coolant from said at least one of said conduits in the part of said inner wall passing adjacent to said magnets.

7. Apparatus as in claim 6 further comprising
    gasket means between said additional support tube and the respective supply and discharge means, thereby preventing leakage of coolant as said target support rotates relative to said magnet assembly.

8. Apparatus as in claim 1 further comprising
    an additional support tube fixed to said inner wall of said tubular target support and having a pair of axially opposed ends, said coolant conduit means comprising a plurality of conduits extending axially into one end of said additional support tube and being connected in pairs inside of the other end,
    coolant supply means adjacent said one end for supplying coolant to one conduit in a pair, and
    coolant discharge means adjacent said one end for receiving coolant from the other conduit in the pair being supplied by said supply means.

9. Apparatus as in claim 1 wherein said conduit means comprises discrete metal conduits passing between said magnets.

10. Apparatus as in claim 1 further comprising diaphragm means interposed between said magnets and said inner wall, said conduit means comprising said magnets and said inner wall.

* * * * *